(12) United States Patent
Chen et al.

(10) Patent No.: US 9,455,291 B2
(45) Date of Patent: Sep. 27, 2016

(54) BLUE ENHANCED IMAGE SENSOR

(71) Applicant: OMNIVISION TECHNOLOGIES, INC., Santa Clara, CA (US)

(72) Inventors: Gang Chen, San Jose, CA (US); Duli Mao, Sunnyvale, CA (US); Yuanwei Zheng, San Jose, CA (US); Chih-Wei Hsiung, San Jose, CA (US); Arvind Kumar, Fremont, CA (US); Dyson H. Tai, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 8 days.

(21) Appl. No.: 14/601,010

(22) Filed: Jan. 20, 2015

(65) Prior Publication Data
US 2016/0211295 A1 Jul. 21, 2016

(51) Int. Cl.
*H01L 31/00* (2006.01)
*H01L 27/146* (2006.01)

(52) U.S. Cl.
CPC ...... *H01L 27/14621* (2013.01); *H01L 27/1464* (2013.01); *H01L 27/14612* (2013.01); *H01L 27/14643* (2013.01); *H01L 27/14645* (2013.01)

(58) Field of Classification Search
CPC .......... H01L 27/14605; H01L 27/1464; H01L 27/14643; H01L 27/14645
USPC ........... 257/228, 291–294, 440, 447, 460
See application file for complete search history.

(56) References Cited

U.S. PATENT DOCUMENTS

| 4,011,016 | A | 3/1977 | Layne et al. |
| 4,238,760 | A | 12/1980 | Carr |
| 7,741,666 | B2 | 6/2010 | Nozaki et al. |
| 2010/0109060 | A1 | 5/2010 | Mao et al. |
| 2014/0084135 | A1 | 3/2014 | Chen et al. |
| 2014/0285691 | A1* | 9/2014 | Honda .............. H01L 27/14621 348/276 |

FOREIGN PATENT DOCUMENTS

WO WO 02/27804 A2 4/2002

OTHER PUBLICATIONS

U.S. Appl. No. 14/612,961, filed Feb. 3, 2015, Chen et al.
Honda, H. et al., "A Color CMOS Imager With 4×4 White-RGB Color Filter Array for Increased Low-Illumination Signal-to-Noise Ratio," IEEE Transactions on Electron Devices, vol. 56, No. 11, Nov. 2009, IEEE, pp. 2398-2402.

\* cited by examiner

*Primary Examiner* — Matthew E Warren
(74) *Attorney, Agent, or Firm* — Blakely Sokoloff Taylor & Zafman LLP

(57) ABSTRACT

A back side illuminated image sensor includes a semiconductor material having a front side and a back side. The semiconductor material is disposed between image sensor circuitry and a light filter array. The image sensor circuitry is disposed on the front side, and the light filter array is disposed proximate to the back side. The image sensor includes a first pixel with a first doped region that extends from the image sensor circuitry into the semiconductor material a first depth. The first pixel also includes a second doped region that is disposed between the back side of the semiconductor material and the first doped region. The second doped region is electrically isolated from the first doped region. A second pixel with a third doped region is also included in the image sensor. The third doped region extends from the image sensor circuitry into the semiconductor material a second depth.

19 Claims, 4 Drawing Sheets

BLUE ENHANCED IMAGE SENSOR

BACKGROUND INFORMATION

1. Field of the Disclosure

The present invention relates generally to semiconductor devices. More specifically, examples of the present invention are related to image sensors with enhanced blue light absorption.

2. Background

Image sensors have become ubiquitous. They are widely used in digital still cameras, cellular phones, security cameras, as well as, medical, automobile, and other applications. The technology used to manufacture image sensors, has continued to advance at great pace. For example, the demands of higher resolution and lower power consumption have encouraged the further miniaturization and integration of these devices.

One type of image sensor, the complementary metal oxide semiconductor (CMOS) image sensor, is very popular in commercial electronics. However, as these semiconductor devices have scaled downward, photodiode area has also decreased resulting in a lower incident photon count on each photodiode. Several challenges for downscaled CMOS image sensors are maintaining low-light sensitivity and reducing image noise—two problems exacerbated by low a incident photon count.

Enhancing quantum efficiency and reducing cross talk are commonly accepted ways to improve CMOS image sensor performance as they may result in a more favorable signal to noise ratio. One way to improve quantum efficiency is to increase semiconductor thickness such that a photodiode can absorb more light before the light can penetrate the sensing volume. However, blue pixel quantum efficiency doesn't improve with increased semiconductor thickness, because this high-energy (short wave length) light is absorbed at the very surface of the semiconductor. Additionally, the typical light filter color choices (e.g. red, green, blue) block much of the blue light incident on the surface of CMOS devices, further limiting blue photon absorption.

BRIEF DESCRIPTION OF THE DRAWINGS

Non-limiting and non-exhaustive examples of the present invention are described with reference to the following figures, wherein like reference numerals refer to like parts throughout the various views unless otherwise specified.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

As will be shown, methods and apparatuses directed to image sensors with enhanced blue light absorption are disclosed. In the following description, numerous specific details are set forth in order to provide a thorough understanding of the present invention. One skilled in the relevant art will recognize; however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment," "an embodiment," "one example," or "an example" means that a particular feature, structure, or characteristic described in connection with the embodiment or example is included in at least one embodiment or example of the present invention. Thus, the appearances of the phrases such as "in one embodiment" or "in one example" in various places throughout this specification are not necessarily all referring to the same embodiment or example. Furthermore, the particular features, structures, or characteristics may be combined in any suitable manner in one or more embodiments or examples.

Figure 1:
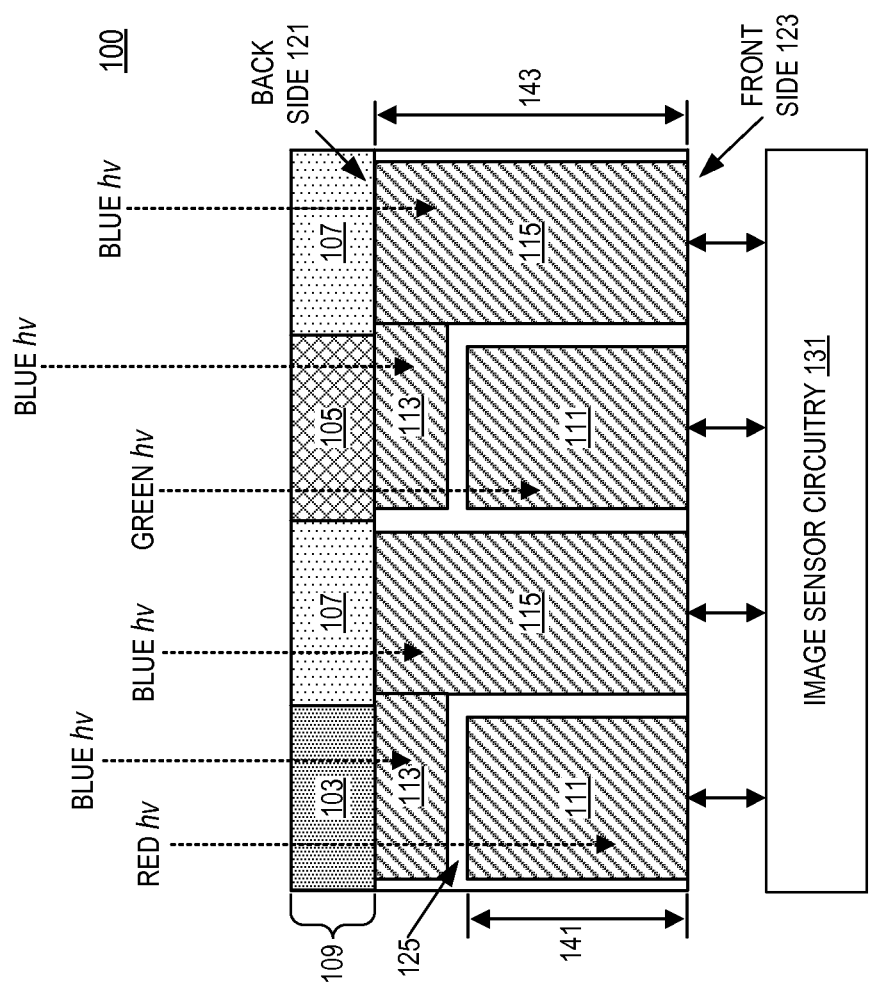
FIG. 1 is a cross-sectional view illustrating one example of a back side illuminated image sensor, in accordance with the teachings of the present invention.

FIG. 1 is a cross-sectional view illustrating one example of back side illuminated image sensor 100. Back side illuminated image sensor 100 includes semiconductor material 125 having a front side 123 and a back side 121, image sensor circuitry 131, and light filter array 109. Semiconductor material 125 is disposed between image sensor circuitry 131 and light filter array 109. Image sensor circuitry 131 may be disposed on the front side 123 of semiconductor material 125 and light filter array 109 may be disposed proximate to the back side 121 of semiconductor material 125.

A first pixel is disposed in back side illuminated image sensor 100. The first pixel includes first doped region 111 disposed in semiconductor material 125. First doped region 111 extends from image sensor circuitry 131 into semiconductor material 125 a first depth 141. The first pixel also includes second doped region 113 disposed between the back side 121 of the semiconductor material 125 and first doped region 111. Second doped region 113 is disposed in the semiconductor material 125 such that the second doped region 113 absorbs blue light. In one example, the second doped region 113 extends from the back side 121 of the semiconductor material 125 into semiconductor material 125 0.75 µm or less, in order to avoid absorbing appreciable amounts of green light and red light. In on example, second doped region 113 is electrically isolated from first doped region 111.

Back side illuminated image sensor 100 further contains a second pixel including third doped region 115 disposed in semiconductor material 125. Third doped region 115 extends from image sensor circuitry 131 into semiconductor material 125 a second depth 143. In one example, second depth 143 is greater than first depth 141. In one example, second doped region 113 and third doped region 115 are electrically coupled.

In one or more examples, back side illuminated image sensor 100 may further include a plurality of first doped regions 111, second doped regions 113, and third doped regions 115. In these examples, light filter array 109 may include several unconventional light filters. A first light filter 103 in light filter array 109 may permit the passage of blue light and red light and is disposed proximate to at least one of the second doped regions 113. A second light filter 105 in light filter array 109 may permit the passage of blue light and green light and is disposed proximate to at least another one of the second doped regions 113. A third light filter 107 in the light filter array 109 may permit the passage of blue light and is disposed proximate to at least one of the third doped regions 115. In another or the same example, back side illuminated image sensor 100 may include a third pixel including at least another one of the third doped regions 115 and a fourth light filter in the light filter array (e.g. one of light filters 107). The fourth light filter may be disposed proximate to the third pixel and permits the passage of blue light, red light, and green light. This third pixel may act as a "white pixel" and output the image charge generated by incident blue light, green light, and red light.

It is worth noting that semiconductor material 125, first doped region 111, second doped region 113, and third doped region 115, can be fabricated from a wide array of semiconductor elements and compounds. In one example, semiconductor material 125 may include silicon; however, in the same or a different example, semiconductor material 125 may include germanium, gallium, arsenic, or the like. In one example, semiconductor material 125 is p-type, and first doped region 111, second doped region 113, and third doped region 115 are n-type. However, in a different example, semiconductor material 125 is n-type, and first doped region 111, second doped region 113, and third doped region 115 are p-type.

In operation, back side illuminated image sensor 100 employs different doped regions to receive different wavelengths of light. Using unconventional light filters (e.g. light filters that permit the passage of blue light, blue light and red light, and blue light and green light) and doped regions located at varied depths in the semiconductor material 125, blue absorption can be improved. For instance, in one example, first light filter 103 may permit the passage of blue light and red light. Once blue and red photons pass through first light filter 103, blue light is absorbed by second doped region 113. Conversely, red light passes through second doped region 113 and is substantially absorbed by first doped region 111. Second doped region 113 is disposed proximate to the back side 121 of semiconductor layer 125 due to blue light's short extinction length—relative to red light—in commonly employed semiconductor materials. Since red light has a longer extinction length, it is free to pass through second doped region 113 and into first doped region 111. This allows back side illuminated image sensor 100 to absorb more blue light than if the surface area of semiconductor material 125 was allocated into the standard red, green, and blue light filter array. This same process can also be used to increase blue light absorption while measuring green light. In one example, second light filter 105 permits the passage of blue light and green light. Once blue and green photons pass through second light filter 105, blue light is absorbed by second doped region 113. Green light passes through second doped region 113 and is substantially absorbed by first doped region 111. Since green light has a longer extinction length than blue light in commonly employed semiconductors, it is free to pass through second doped region 113 and into first doped region 111. Third light filter 107 permits the passage of blue light. Blue light passes through third light filter 107 and is absorbed by third doped region 115.

It should be noted that in the depicted example, second doped region 113 extends over all first doped regions 111. Accordingly, blue light collection is improved as almost all surface area on back side illuminated image sensor 100 is used to acquire blue light. Further, both green and red signals are still easily measured by virtue of first doped region 111 substantially absorbing all green or red light. In one example, several second doped regions 113 may be electrically coupled together and also be coupled to the third doped region 115. In another or the same example, three second doped regions are electrically coupled together and coupled to the third doped region 115. In order to prevent image charge from flowing between uncoupled doped regions, in one example, first doped region 111 is electrically isolated from second doped region 113 and third doped region 115 by pinning wells located in semiconductor layer 125 between all or some of the doped regions. Additionally, in another example, first doped region 111 is disposed in semiconductor material 125 at least 0.75 µm away from the back side 121 of semiconductor material 125. This helps to prevent accidental absorption of blue light and subsequent optical cross talk as blue light's extinction length in many commonly employed semiconductors is less than 0.75 µm.

Figure 2A:
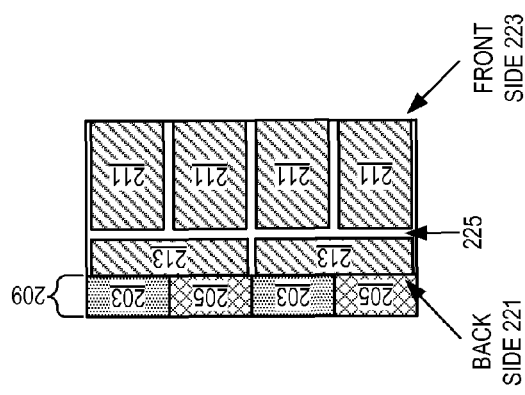
FIG. 2A is a diagram illustrating one example of a top-down view of a back side illuminated image sensor, in accordance with the teachings of the present invention.

FIG. 2A is a diagram illustrating one example of a top-down view of a back side illuminated image sensor (e.g. back side illuminated image sensor 100). In the depicted example, the first pixel and the second pixel are arranged in a 2-by-2 array. A first row of the array may include two of the first doped regions. A second row of the array may include the first doped region and the third doped region. The second doped region may be disposed between the light filter array and all first doped regions. In another example, a third pixel may be present which includes a fourth light filter in the light filter array. This light filter permits the passage of blue light, green light, and red light. Accordingly, the third pixel may act as a "white pixel" and generate image charge in response to incident blue light, green light, and red light.

Figure 2B:
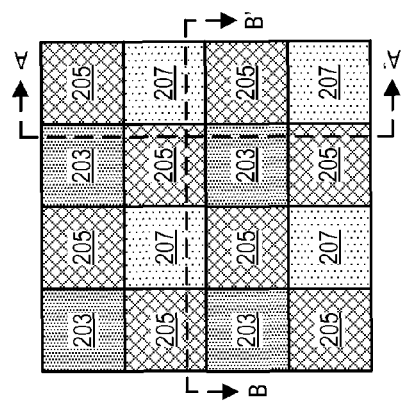
FIG. 2B is a cross-sectional view illustrating the example image sensor in FIG. 2A as cut along line A-A', in accordance with the teachings of the present invention.

FIG. 2B is a cross-sectional view illustrating the example image sensor in FIG. 2A along dashed line A-A'. In the depicted example, second doped region 213 extends over first doped regions 211. As a result of second doped region 213 extending over first doped regions 211, blue light is prevented from reaching first doped regions 211. In one example, the lateral bounds of second doped region 213 are aligned with the lateral bounds of first doped regions 211 disposed under the second doped region 213. However, in an alternate example, the lateral bounds of second doped region 213 may extend beyond the lateral bounds of the underlying first doped regions 211, or the lateral bounds of the underlying first doped regions 211 may extend beyond the lateral bounds of second doped region 213.

Figure 2C:
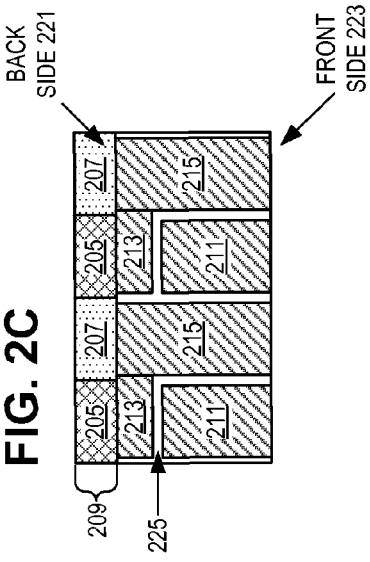
FIG. 2C is a cross-sectional view illustrating the example image sensor in FIG. 2A as cut along line B-B', in accordance with the teachings of the present invention.

FIG. 2C is a cross-sectional view illustrating the example image sensor in FIG. 2A along dashed line B-B'. In the depicted example, first doped region 211 is disposed beneath second doped region 213. Additionally, second doped region 213 extends over first doped region 211, and the lateral bounds of first doped region 211 and second doped region 213 are aligned. However, in an alternate example, the lateral bounds of second doped region 213 may extend beyond the lateral bounds of the underlying first doped region 211, or the lateral bounds of the underlying first doped region 211 may extend beyond the lateral bounds of second doped region 213. Third doped region 215 is disposed next to first doped region 211 and is electrically coupled to second doped region 213. In the depicted example, second doped region 213 and third doped region 215 are electrically coupled by virtue of overlapping doped regions. However, in an alternate example, second doped region 213 and third doped region 215 are electrically coupled by other pieces of wiring and/or circuitry not depicted.

Figure 3:
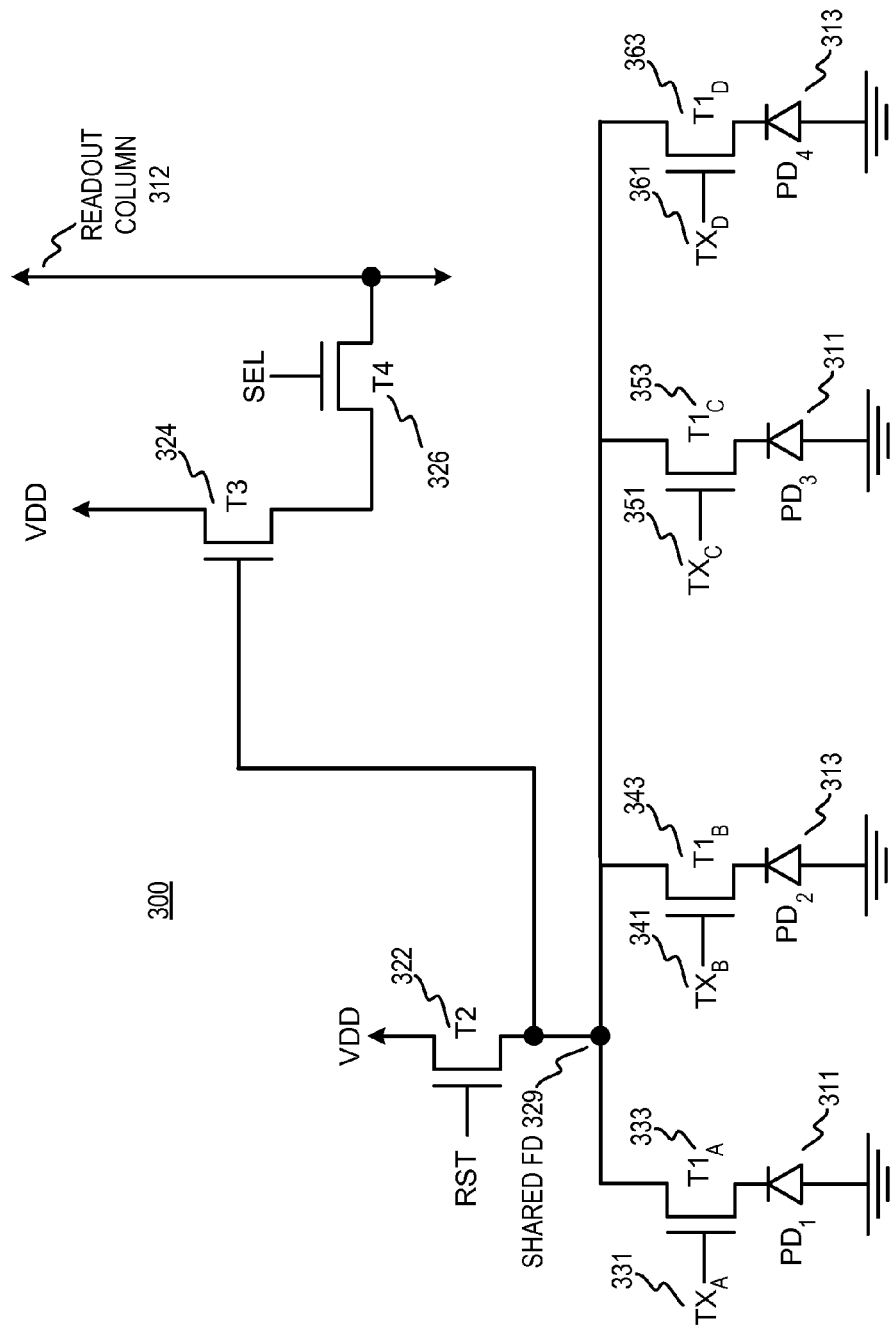
FIG. 3 is a schematic illustrating one example of an image sensor circuit, in accordance with the teachings of the present invention.

FIG. 3 is a schematic illustrating one example of an image sensor circuit 300. In the depicted example, image sensor circuit 300 includes a plurality of first photodiode 311, a plurality of second photodiode 313, first transfer transistor 333, second transfer transistor 343, floating diffusion 329, reset transistor 322, amplifier transistor 324, and row select transistor 326 coupled to readout column 312.

In operation, image charge is accumulated in photodiodes 311 and photodiodes 313 (which may include first doped region 111, second doped region 113, and third doped region 115). When incident light enters photodiodes 311/photodiodes 313 and is converted into hole-electron pairs, image charge may be transferred to floating diffusion 329 to be readout as image data. First transfer transistor 333 and second transfer transistor 343 may be coupled between photodiode 311/photodiode 313 and floating diffusion 329 to selectively transfer the image charge from photodiode 311/photodiode 313 to floating diffusion 329. In one example, first transfer transistor 333 is electrically coupled between the first doped region (contained in photodiode 311) and floating diffusion 329, and second transfer transistor 343 is coupled between the third doped region (contained in photodiode 313) and floating diffusion 329.

The example in FIG. 3 also illustrates reset transistor 322 as coupled between a reset voltage $V_{DD}$ and floating diffusion 329 to selectively reset the charge in floating diffusion 329 in response to a reset signal RST. In the depicted example, amplifier transistor 324 includes an amplifier gate coupled to floating diffusion 329 to amplify the signal on floating diffusion 329 to output image data. Row select transistor 326 is coupled between readout column 312 and amplifier transistor 324 to output the image data to readout column 312.

In the depicted example, four photodiodes (two of which being identical) share the same floating diffusion 329. In this example, each photodiode has its own transfer transistor. Charge may be transferred from the four photodiodes to the floating diffusion 329 in series or simultaneously by applying a voltage to each transfer transistor. Although the example depicted in FIG. 3 shows four photodiodes connected to floating diffusion 329, in a different example any number of photodiodes can be connected to floating diffusion 329. For instance, in an alternate example, each photodiode may be coupled to its own floating diffusion and reset transistor.

Figure 4:
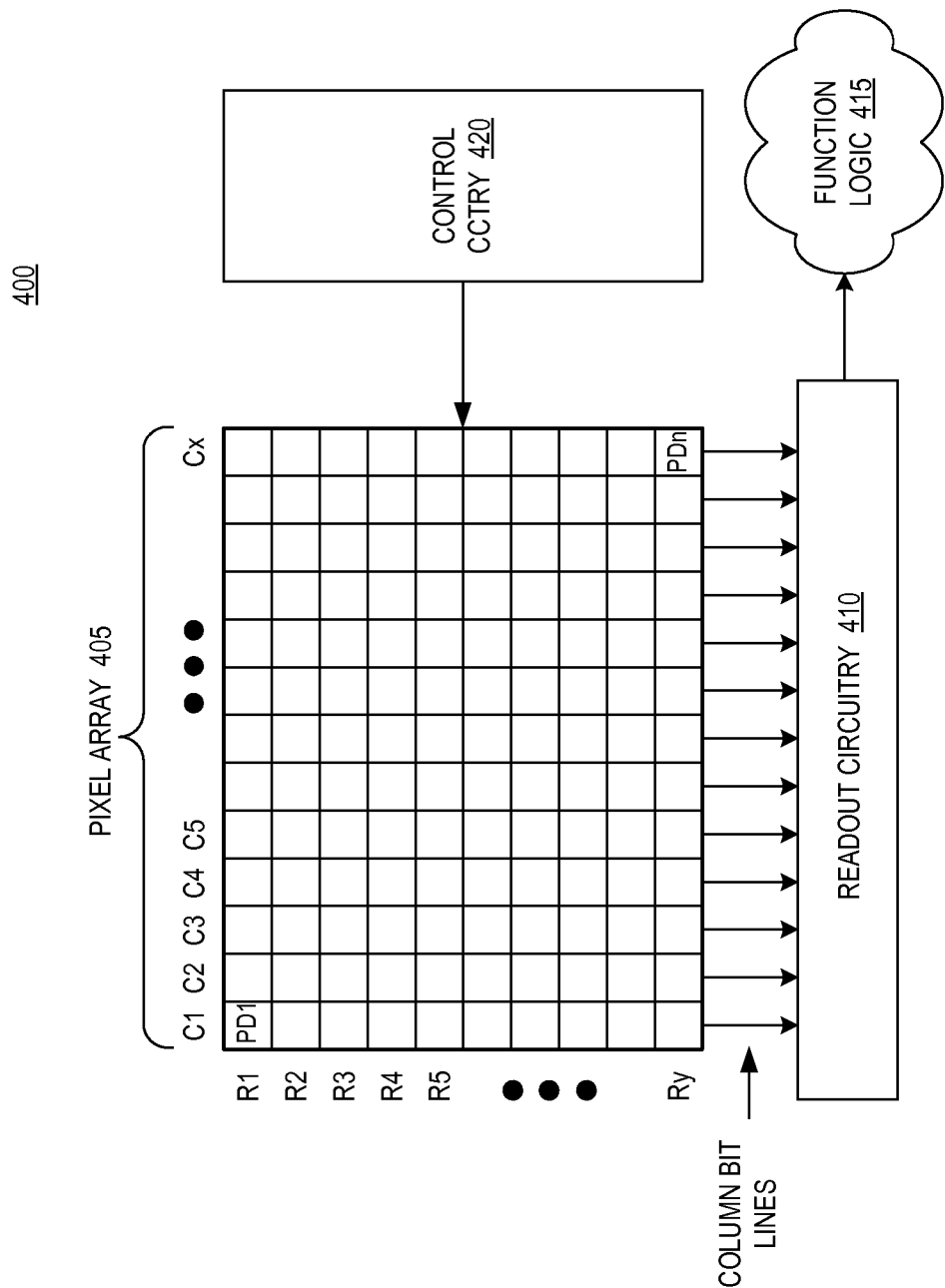
FIG. 4 is a diagram illustrating one example of an imaging system, in accordance with the teachings of the present invention.

FIG. 4 is a diagram illustrating one example of an imaging system 400. Imaging system 400 includes pixel array 405, readout circuitry 410, function logic 415, and control circuitry 420. Each pixel in pixel array 405 (e.g., pixels P1, P2 . . . , Pn) includes at least one doped region (e.g. first doped region 111, second doped region 113, and/or third doped region 115) disposed in a semiconductor material (e.g. semiconductor material 125). In one example, pixel array 405 is a two-dimensional (2D) array of individual pixels (e.g. pixels P1, P2 . . . , Pn) including rows (e.g. rows R1 to Ry.) and columns (e.g. column C1 to Cx). In one example, it is appreciated that pixel array 405 may be comprised of a repeating 2-by-2 array including the first and second pixel (as shown in FIG. 2). In the same example, the second doped region (e.g. second doped region 113) within the individual 2-by-2 arrays is disposed over the first doped regions (e.g. first doped regions 111) in the individual 2-by-2 arrays, but is decoupled from the second doped regions in other 2-by-2 arrays. Pixel array 405 may be used to acquire image data of a person, place, object, etc., which can then be used to render a 2D image of the person, place, object, etc. In one example, after each image sensor pixel in pixel array 405 has acquired its image data or image charge, image charge is then readout by readout circuitry 410 and transferred to function logic 415. In one example, readout circuitry 410 is coupled to readout the image charge from a floating diffusion (e.g. floating diffusion 329) and function logic 415 is coupled to readout circuitry 410 to perform logic operations on the image charge.

In various examples, readout circuitry 410 may include amplification circuitry, analog-to-digital (ADC) conversion circuitry, or otherwise. Function logic 415 may simply store the image data or even manipulate the image data by applying post image effects (e.g. crop, rotate, remove red eye, adjust brightness, adjust contrast, or otherwise). In one example, readout circuitry 410 may readout a row of image data at a time along readout column lines (illustrated) or may readout the image data using a variety of other techniques (not illustrated), such as a serial readout or a full parallel readout of all pixels simultaneously.

In one example, control circuitry 420 is coupled to control operation of the pixels (e.g. P1, P2, P3, etc.) in pixel array 405. For example, control circuitry 420 may generate a shutter signal for controlling image acquisition. In one example, the shutter signal is a global shutter signal for simultaneously enabling all pixels within pixel array 405 to simultaneously capture their respective image data during a single acquisition window. In another example, the shutter signal is a rolling shutter signal such that each row, column, or group of pixels is sequentially enabled during consecutive acquisition windows. In another example, image acquisition is synchronized with lighting effects such as a flash.

In one example, imaging system 400 may be included in a digital camera, cell phone, laptop computer, or the like. Additionally, imaging system 400 may be coupled to other elements of hardware such as a processor, memory elements, output (USB port, wireless transmitter, HDMI port, etc.), lighting/flash, electrical input (keyboard, touch display, track pad, mouse, microphone, etc.), and/or display. Other elements of hardware may deliver instructions to imaging system 400, extract image data from imaging system 400, or manipulate image data supplied by imaging system 400.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example structures, materials, use-cases etc., are provided for explanation purposes and that substitutes may also be employed in other embodiments and examples in accordance with the teachings of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. A back side illuminated image sensor comprising:
a semiconductor material having a front side and a back side;
image sensor circuitry and a light filter array, wherein the semiconductor material is disposed between the image sensor circuitry and the light filter array, and wherein the image sensor circuitry is disposed on the front side of the semiconductor material and the light filter array is disposed proximate to the back side of the semiconductor material;
a first pixel including:
    a first doped region disposed in the semiconductor material, wherein the first doped region extends from the image sensor circuitry into the semiconductor material a first depth; and
    a second doped region disposed in the semiconductor material, wherein the second doped region is disposed between the back side of the semiconductor material and the first doped region, and wherein the second doped region is electrically isolated from the first doped region; and
a second pixel including a third doped region disposed in the semiconductor material, wherein the third doped region extends from the image sensor circuitry into the semiconductor material a second depth;
a plurality of the first doped region, the second doped region, and the third doped region;
a first light filter in the light filter array which permits the passage of blue light and red light and is optically aligned with at least one of the second doped regions in the plurality of second doped regions;
a second light filter in the light filter array which permits the passage of blue light and green light and excludes red light and is optically aligned with at least another one of the second doped regions in the plurality of second doped regions; and
a third light filter in the light filter array which permits the passage of blue light and is optically aligned with at least one of the third doped regions in the plurality of third doped regions.

2. The back side illuminated image sensor of claim 1 wherein the second doped region and the third doped region are electrically coupled.

3. The back side illuminated image sensor of claim 2 wherein the first pixel and the second pixel are arranged in a 2-by-2 array, wherein a first row of the array includes two of the first doped regions, and wherein a second row of the array includes the first doped region and the third doped region, and wherein the second doped region is disposed between the light filter array and the first doped regions.

4. The back side illuminated image sensor of claim 3 wherein the 2-by-2 array repeats itself, and wherein the second doped region within the individual 2-by-2 arrays is decoupled from the second doped region in other 2-by-2 arrays.

5. The back side illuminated image sensor of claim 1 further comprising:
a third pixel including at least another one of the third doped regions; and
a fourth light filter in the light filter array, wherein the fourth light filter is disposed proximate to the third pixel and permits the passage of blue light, red light, and green light.

6. The back side illuminated image sensor of claim 1 wherein the second doped region is disposed in the semiconductor material such that the second doped region absorbs blue light.

7. The back side illuminated image sensor of claim 6 wherein the second doped region extends from the back side of the semiconductor material into the semiconductor material 0.75 µm or less.

8. The back side illuminated image sensor of claim 1 wherein the first doped region is disposed in the semiconductor material at least 0.75 µm away from the back side of the semiconductor material.

9. The back side illuminated image sensor of claim 1 wherein the semiconductor material is p-type, and wherein the first doped region, the second doped region, and the third doped region are n-type.

10. The back side illuminated image sensor of claim 1 wherein the semiconductor material is n-type, and wherein the first doped region, the second doped region, and the third doped regions are p-type.

11. The back side illuminated image sensor of claim 1 wherein the first doped region is electrically isolated from the second doped region and the third doped region by pinning wells.

12. The back side illuminated image sensor of claim 1 wherein the second depth is greater than the first depth.

13. An imaging system, the imaging system comprising:
a pixel array including a semiconductor material, wherein the semiconductor material has a front side and a back side;
image sensor circuitry and a light filter array, wherein the semiconductor material is disposed between the image sensor circuitry and the light filter array, and wherein the image sensor circuitry is disposed on the front side of the semiconductor material and the light filter array is disposed proximate to the back side of the semiconductor material;
a first pixel including:
    a first doped region disposed in the semiconductor material, wherein the first doped region extends from the image sensor circuitry into the semiconductor material a first depth; and
    a second doped region disposed in the semiconductor material, wherein the second doped region is disposed between the back side of the semiconductor material and the first doped region, and wherein the second doped region is electrically isolated from the first doped region; and
a second pixel including a third doped region disposed in the semiconductor material, wherein the third doped region extends from the image sensor circuitry into the semiconductor material a second depth, and wherein the third doped region is electrically coupled to the second doped region;
a plurality of the first doped region, the second doped region, and the third doped region;
a first light filter in the light filter array which permits the passage of blue light and red light and is optically aligned with at least one of the second doped regions in the plurality of second doped regions;
a second light filter in the light filter array which permits the passage of blue light and green light and excludes red light and is optically aligned with at least another one of the second doped regions in the plurality of second doped regions; and a third light filter in the light filter array which permits the passage of blue light and is optically aligned with at least one of the third doped regions in the plurality of third doped regions.

14. The imaging system of claim 13 further comprising a third pixel, wherein the third pixel includes a fourth light filter in the light filter array which permits the passage of blue light, green light, and red light, and wherein the third pixel generates image charge in response to incident blue light, green light, and red light.

15. The imaging system of claim 13 wherein the first doped region is electrically isolated from the second doped region and the third doped region by pinning wells.

16. The imaging system of claim 13 further comprising a floating diffusion, wherein the first pixel and the second pixel are electrically coupled to the floating diffusion.

17. The imaging system of claim 16 further comprising a first transfer transistor electrically coupled between the first doped region and the floating diffusion, and a second transfer transistor electrically coupled between the third doped region and the floating diffusion.

18. The imaging system of claim 13 wherein the pixel array comprises rows and columns of pixels.

19. The imaging system of claim 13 wherein the image sensor circuitry includes:

readout circuitry coupled to the pixel array, wherein the readout circuitry is coupled to readout image charge from the pixel array;

function logic coupled to the readout circuitry to manipulate the image charge readout of the pixel array; and control circuitry to control operation of pixel array.

* * * * *